United States Patent
Farrar et al.

(10) Patent No.: US 6,239,684 B1
(45) Date of Patent: *May 29, 2001

(54) HIGH-Q INDUCTIVE ELEMENTS

(75) Inventors: Paul A. Farrar, So. Burlington, VT (US); Leonard Forbes, Corvallis, OR (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/460,655

(22) Filed: Dec. 14, 1999

Related U.S. Application Data

(62) Division of application No. 09/069,346, filed on Apr. 29, 1998, now Pat. No. 6,025,261.

(51) Int. Cl.[7] ...................................................... H01F 5/00
(52) U.S. Cl. ............................ 336/200; 336/223; 336/232
(58) Field of Search .................................... 336/200, 223, 336/232

(56) References Cited

U.S. PATENT DOCUMENTS

| | | | |
|---|---|---|---|
| 3,932,226 | 1/1976 | Klatskin et al. | 204/16 |
| 4,670,297 | 6/1987 | Lee et al. | 427/91 |
| 4,857,481 | 8/1989 | Tam et al. | 437/182 |
| 5,158,986 | 10/1992 | Cha et al. | 521/82 |
| 5,202,754 | 4/1993 | Bertin et al. | |
| 5,227,658 | 7/1993 | Beyer et al. | 257/522 |
| 5,232,866 | 8/1993 | Beyer et al. | 437/62 |
| 5,268,315 | 12/1993 | Prasad et al. | 437/31 |
| 5,270,261 | 12/1993 | Bertin et al. | |
| 5,308,440 | 5/1994 | Chino et al. | 156/664 |
| 5,334,356 | 8/1994 | Baldwin et al. | 422/133 |
| 5,349,743 | * 9/1994 | Grader et al. | 29/602.1 |
| 5,396,093 | 3/1995 | Lu | 257/306 |
| 5,410,169 | 4/1995 | Yamamoto et al. | 257/301 |
| 5,436,173 | 7/1995 | Houston | 437/21 |
| 5,438,009 | 8/1995 | Yang et al. | 437/52 |
| 5,497,017 | 3/1996 | Gonzales | 257/306 |
| 5,504,357 | 4/1996 | Kim et al. | 257/306 |
| 5,539,227 | 7/1996 | Nakano | 257/276 |
| 5,593,921 | 1/1997 | Chen et al. | 437/195 |
| 5,705,425 | 1/1998 | Miura et al. | 437/182 |
| 5,798,544 | 8/1998 | Ohya et al. | 257/296 |
| 5,892,707 | 4/1999 | Noble | 365/149 |
| 5,930,596 | 7/1999 | Klose et al. | 438/98 |
| 5,930,668 | 7/1999 | Gardner | 438/624 |

OTHER PUBLICATIONS

Abidi, "Large Self–Suspended Inductors on Silicon and Their Use in 2–mu m CMOS RF Amplifier", *IEEE Electron Device Letters*, vol. 17, No. 9, 246–48, (1993).

Burghartz, et al., "Integrated RF and Microwave Components in BiCMOS Technology", IEEE Trans. Electron Devices, vol. 43, No. 9, 1559–70, (1996).

Burghartz, et al., "Multi–level Spiral Inductors Using VLSI Interconnect Technology", *IEEE Electron Device Letters*, vol. 17, No. 9, 428–30, (1996).

(List continued on next page.)

*Primary Examiner*—Anh Mai
(74) *Attorney, Agent, or Firm*—Schwegman, Lundberg, Woessner & Kluth, P.A.

(57) ABSTRACT

A first insulator is formed on a base layer. A first conductor is formed on the first insulator. The first conductor is patterned. A second insulator is formed over the first insulator. A via hole is formed in the second insulator and is electrically coupled to the first conductor through the via hole. A second conductor is formed on the second insulator, and is electrically coupled to the first conductor by the via hole. The second conductor is patterned. A cavity is formed under the second conductor, and in the first and second insulators.

18 Claims, 4 Drawing Sheets

OTHER PUBLICATIONS

Jin, C., et al., "Porous Xerogel Films as Ultra–low Permittivity Dielectrics for ULSI Interconnect Applications", *Advanced Metallization and Interconnect Systems for ULSI Applications*, Boston, MA, 463–469, (Oct. 1996).

Meyer, et al., "Si IC–Compatible Inductors and LC Passive Filters",*IEEE Journal of Solid State Circuits*, vol. 25, No. 4, 1028–31, (1990).

Miller, R.D., et al., "Low Dielectric Constant Polyimides and Polyimide Nanofoams", *Seventh Meeting of the DuPont Symposium on Polymides in Microelectronics*, 443–473, (Sep. 1996).

Ting, C.H., "Methods and Needs for Low K Material Research", Materials Research Society Symposium Proceedings, vol. 381, Low–Dielectric Constant Materials—Synthesis and Applications in Microelectronics, Lu, T.M., et al., (eds.), San Francisco, CA, 3–17, (Apr. 17–19, 1995).

* cited by examiner

HIGH-Q INDUCTIVE ELEMENTS

RELATED APPLICATIONS

This application is a Divisional of U.S. Ser. No. 09/069,346, filed Apr. 29, 1998 now U.S. Pat. No. 6,025,261.

FIELD OF THE INVENTION

The present invention relates generally to integrated circuits, and more specifically to electrical components of integrated circuits.

BACKGROUND OF THE INVENTION

Analog integrated circuits (ICs) are now being extensively used, for example, in wireless radio frequency (RF) applications such as cellular telephones where high frequencies are encountered. Many analog ICs include inductive elements, such as inductors, formed by a conductor. Inductive elements with a relatively high quality (Q) factor, or low loss, are preferably used in analog ICs. As a result, the analog integrated circuits have superior performance, including selectivity, noise figure, and efficiency. Relatively high Q inductors have been formed on insulating bulk semiconductors, such as gallium arsenide.

Most integrated circuits, however, are formed on silicon. In comparison to gallium arsenide ICs, silicon ICs can be fabricated relatively inexpensively. Also, analog and digital circuits may be readily combined on silicon ICs. However, unlike gallium arsenide, silicon is a conductive bulk semiconductor. As a result, conventional inductive elements formed on silicon are relatively lossy, and thus have relatively low Q factors. For example, Q factors of 3 to 8 are reported for inductors fabricated on silicon in Nguyen et al., "Si IC-compatible inductors and LC Passive Filters," IEEE Journal of Solid-State Circuits, vol. 25, no. 4, p. 1028–1031, 1990, herein incorporated by reference.

An inductor formed on an IC 101 may be a conventional rectangular spiral inductor 103, as illustrated in FIG. 1A. The conventional rectangular spiral inductor 103 includes substantially parallel conductive branches 121 that are mutually coupled to increase the rectangular spiral inductor's 103 effective inductance.

The conventional rectangular spiral inductor 103 is formed in the following manner. A first conductor 109 is patterned on the IC 101. Then, an insulator, such as resist, defining the location of air bridges 105, is patterned on the IC 101. Next, a second conductor 107 is patterned on the IC 101. However, where an air bridge 105 is to be formed, the insulator separates the first and second conductors 107, 109. Finally, conventional air bridges 105 are formed by removing the insulator.

Conventional air bridges 105, in this example, permit the two conductors 107, 109 to cross one another, without making electrical contact, as illustrated in FIG. 1B. Conventional air bridges 105 are formed by substantially perpendicular conductors 107, 109 to diminish undesired magnetic coupling between the conductors 107, 109. Further, relatively low-dielectric-constant air typically separates the conductors 107, 109 to diminish undesired capacitive coupling between the conductors 107, 109.

FIG. 1C illustrates a prior art first order lumped element electrical model of the rectangular spiral inductor 103 that describes the electrical characteristics of the rectangular spiral inductor 103 below its self-resonant frequency. The self resonant frequency is the maximum frequency at which the rectangular spiral inductor 103 acts as an inductor. Above the self resonant frequency, for example, the rectangular spiral inductor may exhibit capacitive characteristics.

L is the effective inductance of the rectangular spiral inductor 103. The effective inductance represents the sum of both self and mutual inductances of the branches 121. The inductance, L, of the rectangular spiral inductor 103 is determined by (1) the length of the branches 121, (2) the spacing between the branches 121, and (3) the number of branches 121, or turns.

The other model elements are parasitics that result from the physical implementation of the rectangular spiral inductor 103. $R_{DC}$ and $R_{SKIN\ EFFECT}$ are respectively the lumped element equivalent DC and skin effect resistances of the conductors 107, 109. $R_{DC}$ is determined by the cross-sectional area, length and resistivity of the conductors 107, 109. $R_{SKIN\ EFFECT}$ is determined by the thickness of the conductors 107, 109. $C_S$ is a lumped element equivalent capacitance representing the interwinding capacitances between the parallel conductive branches 121. $C_S$ is determined by both the distance between adjacent branches 121, and the dielectric constant of the material proximate to those adjacent branches 121. The $C_P$s are lumped element equivalent capacitances representing capacitances between the conductors 107, 109 and a ground plane under the IC 101 on which the rectangular spiral inductor 103 is formed. The $C_P$s correspond to the width of the conductors 107, 109, and the thickness and dielectric constant of the material between the conductors 107, 109 and the ground plane. $R_{SUBSTRATE}$ is a lumped element equivalent resistance corresponding to substrate losses. The Q factor and self-resonant frequency of the rectangular spiral inductor 103 are a function of the reactances and resistances described by the electrical model of FIG. 1C.

To increase its Q factor, resistances and/or capacitances of the rectangular spiral inductor 103 should be reduced. One technique for reducing the Q factor of the inductor is disclosed in J. N. Burghartz et al., "Integrated RF and Microwave Components in BiCMOS Technology," IEEE Trans. Electron Devices, vol. 43, no. 9, pp. 1559–1570, 1996 (herein after the "Burghartz Article"), herein incorporated by reference. The Burghartz Article discloses inductors, on silicon ICs, whose conductors are displaced above the silicon, and are encased in oxide. These inductors have Q factors exceeding 10. The higher Q factors arise, in part, because the inductors, disclosed in the Burghartz Article, have relatively lower values of $C_P$ because the conductors are farther displaced from the IC ground plane by the oxide.

Further, the inductors disclosed in the Burghartz Article require a complex five-level metal silicon technology that is more complicated than conventional two-to four-level metal silicon technologies. Therefore, there is a need for inductors having relatively high Q factors that can be formed with conventional silicon technologies.

SUMMARY OF THE INVENTION

The present invention provides a method of forming air bridges, on a substrate or an integrated circuit, which may be used to form inductors and other devices. A first insulator is formed on a base layer. A first conductor is formed on the first insulator. The first conductor is patterned. A second insulator is formed over the first insulator. A via hole is formed in the second insulator. A second conductor is formed on the second insulator, and is electrically coupled to the first conductor by the via hole. The second conductor is patterned. A cavity is formed under the second conductor, and in the first and second insulators. In one embodiment, the first and second conductors form air bridges.

In another embodiment, a support structure is formed during the step of forming the cavity. In yet another embodiment, a conductive pad is formed over the support structure during the step of patterning the second conductor.

In a further embodiment, the present invention provides an air bridge or inductive element on a substrate or integrated circuit. A first insulator is formed on a base layer. A first conductor is formed and patterned on the first insulator. A second insulator is formed on the first insulator. A via hole is formed in the second insulator. A masking layer is developed on the integrated circuit. A cavity, defined by the developed masking layer, is formed in the first and second insulators. The cavity is filled with a polymer. The integrated circuit is cleaned. A second conductor is formed on the polymer, and coupled to the first conductor by the via hole. The second conductor is patterned. In yet a further embodiment, the cavity is filled with a polymer that is foam.

In yet a further embodiment, the inductive element includes a second via hole in the support structure that couples the first and second conductors. In another embodiment, the cavity is filled with a polymer. In yet a further embodiment, the the polymer is a foam.

In another embodiment, an inductive element on a substrate, or an integrated circuit, comprises a base layer. A first conductor is buried in the base layer. An insulator is formed on the base layer. A second conductor, having first and second branches that are substantially parallel, is formed on the second insulator. A plug, formed in the base layer, is coupled to the first conductor. A via hole, formed in the insulator, couples the plug to the second conductor. A cavity, under second conductor, is formed in the insulator. A support structure, in the cavity, props up the second conductor above the base layer.

In yet a further embodiment, an inductive element is formed, on a substrate or an integrated circuit, with a low dielectric inorganic insulator. A first insulator is formed on a base layer. A first conductor is formed on the first insulator. The first conductor is patterned. A second insulator is formed, over the first insulator, from the low dielectric inorganic insulator. A portion of the second insulator is oxidized. The oxidized portion of the second insulator is removed. A via hole is formed in the second insulator. A second conductor, formed on the second insulator, is coupled to the first conductor by the via hole. The second conductor is patterned.

It is a benefit of the present invention that the inductive elements described above have an enhanced Q factor. It is a further advantage of the present invention that the inductive elements described above have an enhanced self-resonant frequency. It is yet a further benefit of the present invention that the inductive elements described above can be formed in conjunction with standard silicon IC processes.

The inductive elements described above can be incorporated in a receiver and/or a transmitter of a communications systems. As a result, the communications system will exhibit higher selectivity and efficiency, and lower noise figure.

BRIEF DESCRIPTION OF THE DRAWINGS

The present invention is described with reference to the accompanying drawings. In the drawings, like reference numbers indicate identical or functionally similar elements. Additionally, the leftmost digit(s) of a reference number identifies the drawing in which the reference number first appears.

DETAILED DESCRIPTION OF THE EMBODIMENTS

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The terms base layer, wafer, and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Base layer, wafer and substrate include doped and undoped semiconductors, epitaxial semiconductor layers supported by a base semiconductor or insulator, as well as other semiconductor structures well known to one skilled in the art. A ground plane may lay underneath the base layer, wafer or substrate. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

This application is related to patent application Ser. No. 09/030,430, patent pending entitled "METHODS AND STRUCTURES FOR METAL INTERCONNECTIONS IN INTEGRATED CIRCUITS," hereby incorporated by reference. This application is also related to patent application Ser. No. 08/892,114, U.S. Pat. No. 6,077,792 entitled "METHOD OF FORMING INSULATING MATERIAL FOR AN INTEGRATED CIRCUIT AND INTEGRATED CIRCUITS RESULTING FROM SAME," hereby incorporated by reference. This application is also related to patent application Ser. No. 08/954,450 U.S. Pat. No. 5,891,797 entitled "METHOD AND SUPPORT STRUCTURE FOR AIR BRIDGE WIRING OF AN INTEGRATED CIRCUIT," hereby incorporated by reference. This application is also related to patent application Ser. No. 08/347,673, now abandoned entitled "ALUMINUM BASED ALLOY BRIDGE STRUCTURE AND METHOD OF FORMING SAME," hereby incorporated by reference.

Figure 2A:
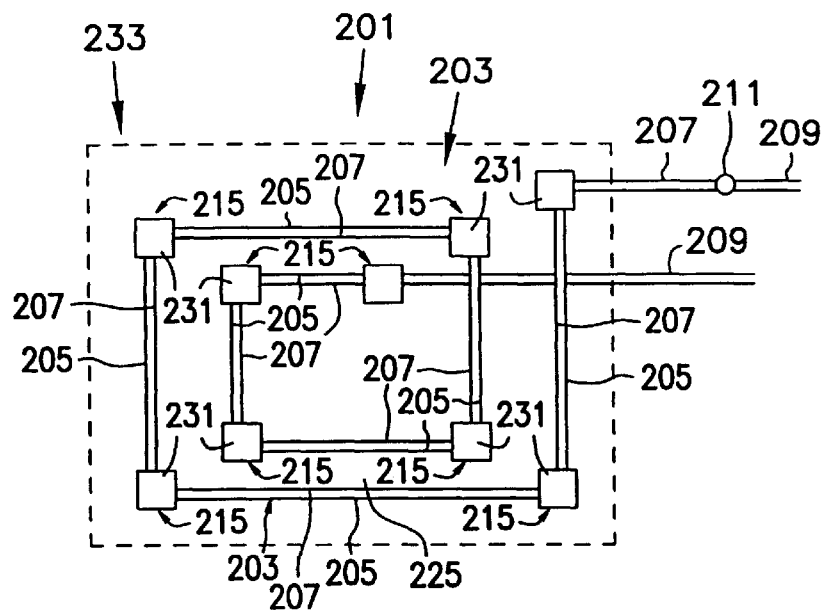
FIG. 2A illustrates a plan view of an integrated circuit including an inductive element.
Figure 2B:
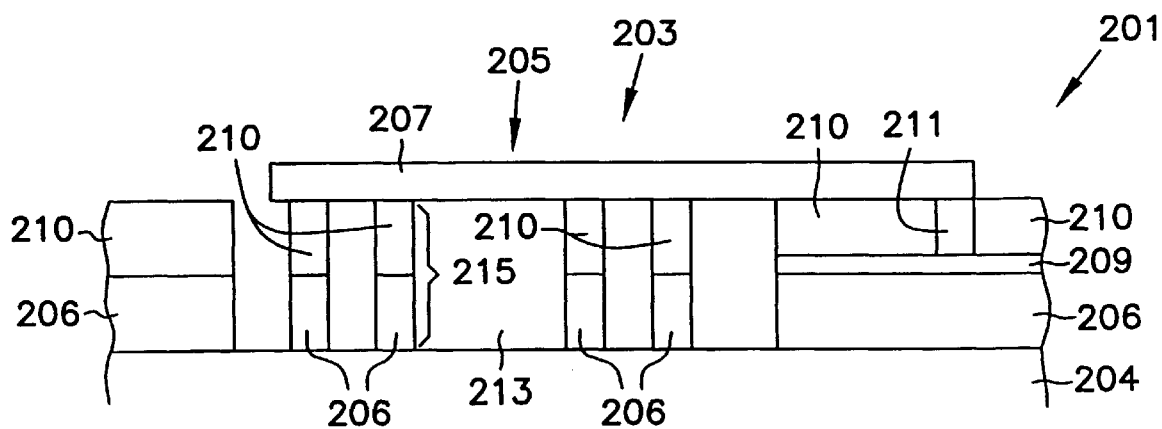
FIG. 2B illustrates a cross-sectional diagram of the integrated circuit including the inductive element.

FIG. 2A illustrates a plan view of one embodiment of the present invention, an inductive element 203, specifically a rectangular spiral inductor, formed on an integrated circuit (IC) 201. The rectangular spiral inductor is formed by air bridges 205 propped up by support structures 215, to diminish undesired capacitive coupling to a ground plane beneath the IC 201. Substantially parallel conductive branches of the spiral inductors are formed by air bridges. FIG. 2B illustrates a cross-sectional view of the inductive element 203. The inductive element 203 can be formed in conjunction with standard silicon processes, for example using only two conductor levels, utilizing the techniques described below.

In one embodiment, the inductive element 203 is formed in the following manner. A first insulator 206 is formed on a base layer 204. In one embodiment, the first insulator 206 and base layer 204 are respectively an oxide, such as silicon dioxide, and a semiconductor, such as silicon.

Then, a first conductor 209 is formed on the first insulator 206. In one embodiment, the first conductor 209 is an aluminum alloy. The first conductor 209 is then patterned to form interconnects to the terminals of the inductive element 203.

Next, a second insulator 210 is formed over the first insulator 206. In one embodiment, the second insulator 210 may be an oxide, such as silicon dioxide. Then, via holes 211 are formed in the second insulator 210. The via holes 211 are filled with a conductor such as an aluminum alloy.

The integrated circuit 201, including the second insulator 210, is subsequently planarized, for example by chemical-mechanical planarization (CMP). Next, a second conductor 207, substantially defining the inductive element 203, is formed and patterned on the integrated circuit 201. In one embodiment, the second conductor 207 is an aluminum alloy. The second conductor 207 is electrically coupled to the first conductor 209 by the via holes 211.

Figure 2C:
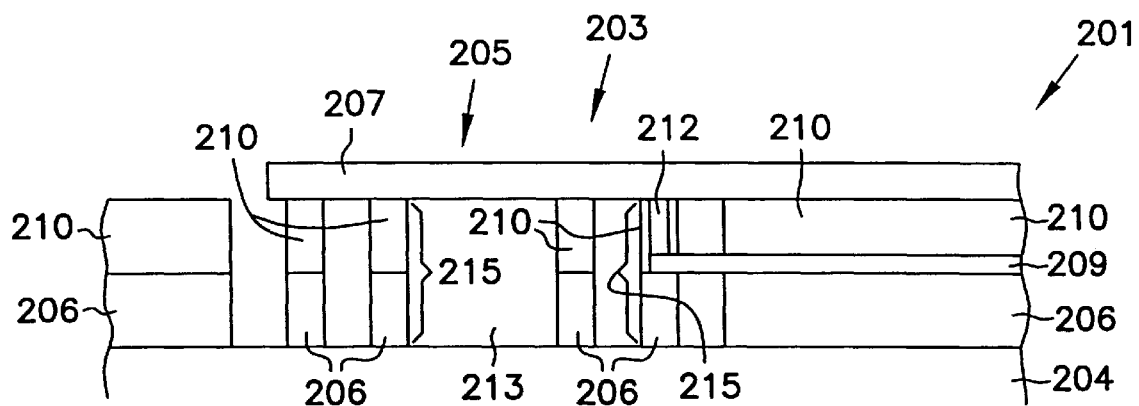
FIG. 2C illustrates a cross-sectional diagram of an integrated circuit including an inductive element and a via hole in a support structure.

In one embodiment, the unterminated end of the second conductor 207, proximate to the center of the inductive element 203, is electrically coupled to the first conductor 209 by a via hole 212 in a support structure 215, as illustrated in FIG. 2C. In such an embodiment, the first conductor 209 extends into a support structure 215. Alternatively, the via hole 212 in the support structure 215 is not required when a support structure 215 is formed with a conductive core and insulating sheath in a manner known to those skilled in the art. In either case, the first conductor 209 is formed at a different height in the cavity 213, and therefore does not directly make electrical contact with the second conductor 207.

A cavity 213 under the second conductor 209 is then formed by directionally etching the first and second insulators 206, 210. In one embodiment, the directional etching is performed by reactive ion etching. Either the second conductor 207 or a separate masking layer 233 formed on the integrated circuit 201 may be used to define the cross section of the cavity 213, and the support structures 215 for propping up the first and second conductors 207, 209. Subsequently, in one embodiment, an anisotropic etch is used to remove undesired first and second insulator 206, 210 in the cavity from under the second conductor 207, while not substantially diminishing the support structures 215.

Figure 1A:
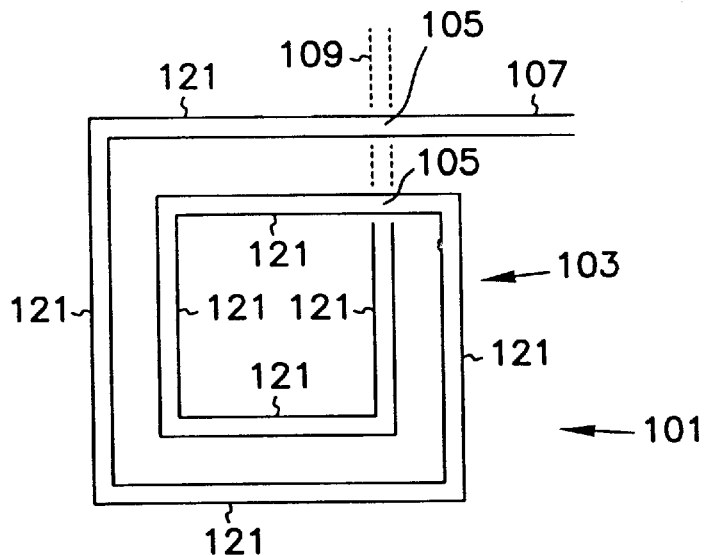
FIG. 1A illustrates a plan view of a prior art rectangular spiral inductor.
Figure 1B:
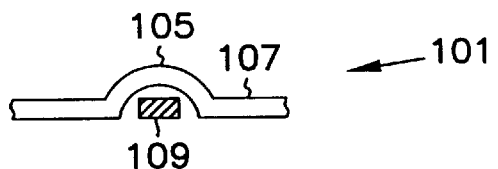
FIG. 1B illustrates a cross-sectional diagram of a prior art air bridge.
Figure 1C:
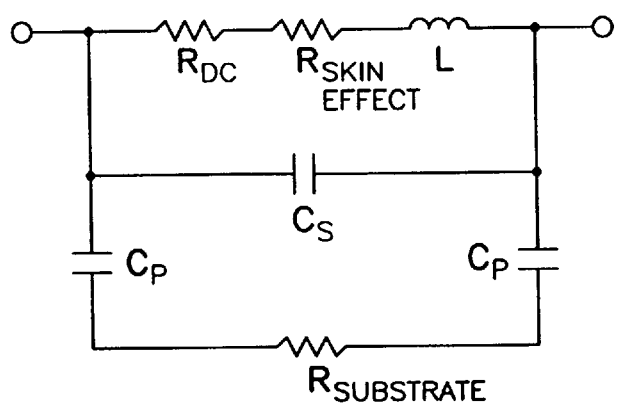
FIG. 1C illustrates a prior art first order lumped element electrical model of a rectangular spiral inductor.

Because the first and second conductors 207, 209 are substantially separated from the base layer 204 and the underlying ground plane by a relatively low-dielectric-constant insulator, air, the $C_P$s, of FIG. 1C, are reduced. Additionally, because the substantially perpendicular branches of the inductive element 203 are capacitively coupled through air, instead of the oxide or silicon, the $C_s$, of FIG. 1C, is also reduced. As a result, the Q factor of the inductive element 203 is increased. Further, the self-resonant frequency of the inductive element 203 is also increased.

In another embodiment of the present invention, conductive pads 231 can be formed during the patterning of the second conductor 207. The conductive pads 231 are formed from the second conductor 207. The conductive pads 231 have a width greater than the width of the second conductor 207 so that the conductive pads 231 have a relatively large surface area that covers the support structures 215. As a result, the conductive pads 231 prevent the anisotropic etch from removing substantially all of the support structures 215 formed beneath the conductive pads 231. The actual size of the support structure 215 is a function of the thickness of the insulators 206, 210, and various etch parameters. The conductive pads 231 may be formed at any point along the second conductor 207 where a support structure 215 is made, but is commonly formed where the path of the second conductor 207 changes directions, such as at the corners as shown in FIG. 2A.

In an alternative embodiment, the cavity 213 and support structures 215 may be formed in a manner that does not necessarily require the anisotropic etch described above. Using the initial steps described above, through formation of the via holes 211, a masking layer 233 is then formed on the second insulator 210 of the integrated circuit 201. The masking layer 233 is developed to define the cross-section of a cavity 213 and support structures 215. The cavity 213 is formed by isotropically etching the insulator 206, 210 not covered by the masking layer 233. The support structures 215 are in the cavity 213.

The cavity 213 and support structures 215 are formed by removing, for example by etching, some of the first and second insulators 206, 209. Alternatively, in yet another embodiment, the cavity 213 is formed simultaneously during the formation of the via holes 211 illustrated in FIG. 2B, in a manner know to those skilled in the art.

In one embodiment, an anisotropic etch is used to remove first insulator 206 covered by the first conductor 209 in the cavity 213. In such a case, the conductive pads 231, described above, are preferably formed over the support structures 215.

The cavity 213 is then filled, for example, with a polymer 225, such as Parylene C, polyimide, or a foam. In one embodiment, the polyimide may be PMDA-ODA. In another embodiment, the foam may be a foam like those disclosed in R. D. Miller et al., "Low Dielectric Constant Polyimides and Polyimide Nanofoams," Seventh Meeting of the DuPont Symposium on Polyimides in Microelectronics, Sep. 16–18, 1996, herein incorporated by reference.

The integrated circuit 201, including the polymer 225, is then planarized, for example with CMP or etch back techniques until at least the via hole 211 is exposed. Then, the integrated circuit 201, including the polymer 225 and second insulator 210, is cleaned to permit the second conductor 207 to form a low resistivity contact to the via hole 211. Next, the second conductor 207, which substantially defines the inductive element 203, is formed and patterned on the integrated circuit 201. The second conductor 207 is formed over the cavity 213 and on the support structures 215.

In one embodiment, the polymer 225 is then removed from the cavity 213 of the integrated circuit 201. As described above, because the first and second conductors 207, 209 over the cavity 213 are substantially formed over a low dielectric insulator, such as air or the polymer 225, the inductive element 203 has both an enhanced Q factor and self-resonant frequency.

Figure 3:
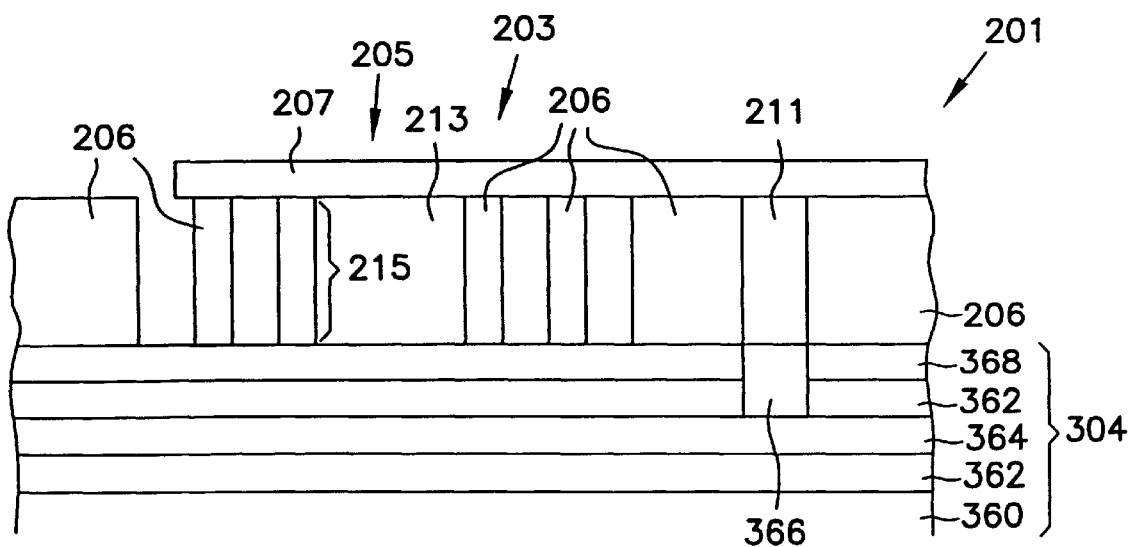
FIG. 3 illustrates a cross-sectional diagram of an integrated circuit including an inductive element and a buried conductor.

In yet a further embodiment, the first conductor 209 and second insulator 210 can be replaced with a conductor buried in the base layer 304, otherwise known as a buried conductor 364, as illustrated in FIG. 3. In FIG. 3, base layer 304 actually comprises a series of layers 360, 362, 364, and 368. Buried conductors 364 facilitate increased IC 201 density. In one embodiment, the buried conductor 364 is positioned between two buried insulators 362, such as oxides. In one embodiment, the buried conductor 364 is tungsten. In this embodiment, the buried insulators 362 separate the buried conductor 364 from first and second semiconductor layers 360, 368, which are respectively $N^+$ and $P^-$ doped silicon. The buried conductor 364 is electrically coupled to the second conductor 207 through a plug 366, which can also be made from tungsten, and a via hole 211.

In yet another embodiment, an inductive element 203 is formed without a cavity 213, diminishing IC 201 processing requirements. A first insulator 206 is formed on the base layer 204. A first conductor 209 is formed on the first insulator 206. The first conductor 209 is patterned. A second insulator 210 is formed, over the first insulator 206, from a low dielectric inorganic insulator. The low dielectric inorganic insulator may be formed from silicon and germanium which are deposited on the integrated circuit 201 at a temperature below the melting point of the metal used for the first conductor 209. A technique for depositing silicon and germanium is described by T. J. King, "Deposition and Properties of Low-Pressure Chemical-Vapor Deposited Polycrystalline Silicon-Germanium Films," Journal of the Electro-Chemical Society, August 1994, pp. 2235–41, which is hereby incorporated by reference. After silicon and germanium deposition is complete, the second insulator 210 is oxidized. The oxidized second insulator contains extractable germanium oxide, which is removed from the second insulator 210. A via hole 211 is formed in the second insulator 210. A second conductor 207 is formed on the second insulator 210. The second conductor 207 is coupled to the first conductor 209 by the via hole 211. The second conductor 207 is patterned.

This process provides a second insulator 210 that is porous, and has a relatively low dielectric constant. As a result, the effective dielectric constant of the portion of the IC underlying the second conductor 207 is reduced, which diminishes $C_P$. Thus, the Q factor and the self-resonant frequency of the inductive element 203 are enhanced. Further, the capacitances of other IC 201 conductors, over the second insulator 210, are desirably diminished.

Further, in another embodiment, the foregoing process can be used to form low dielectric support structures 215 in an inductive element 203 having a cavity 213. As a result, the effective dielectric constant of the support structures 215 is reduced, further diminishing the $C_F$s. Thus, the Q factor and the self-resonant frequency of the inductive element 203 are enhanced. Further, the capacitances of other IC 201 conductors, over the second insulator 210, are desirably diminished.

Figure 4:
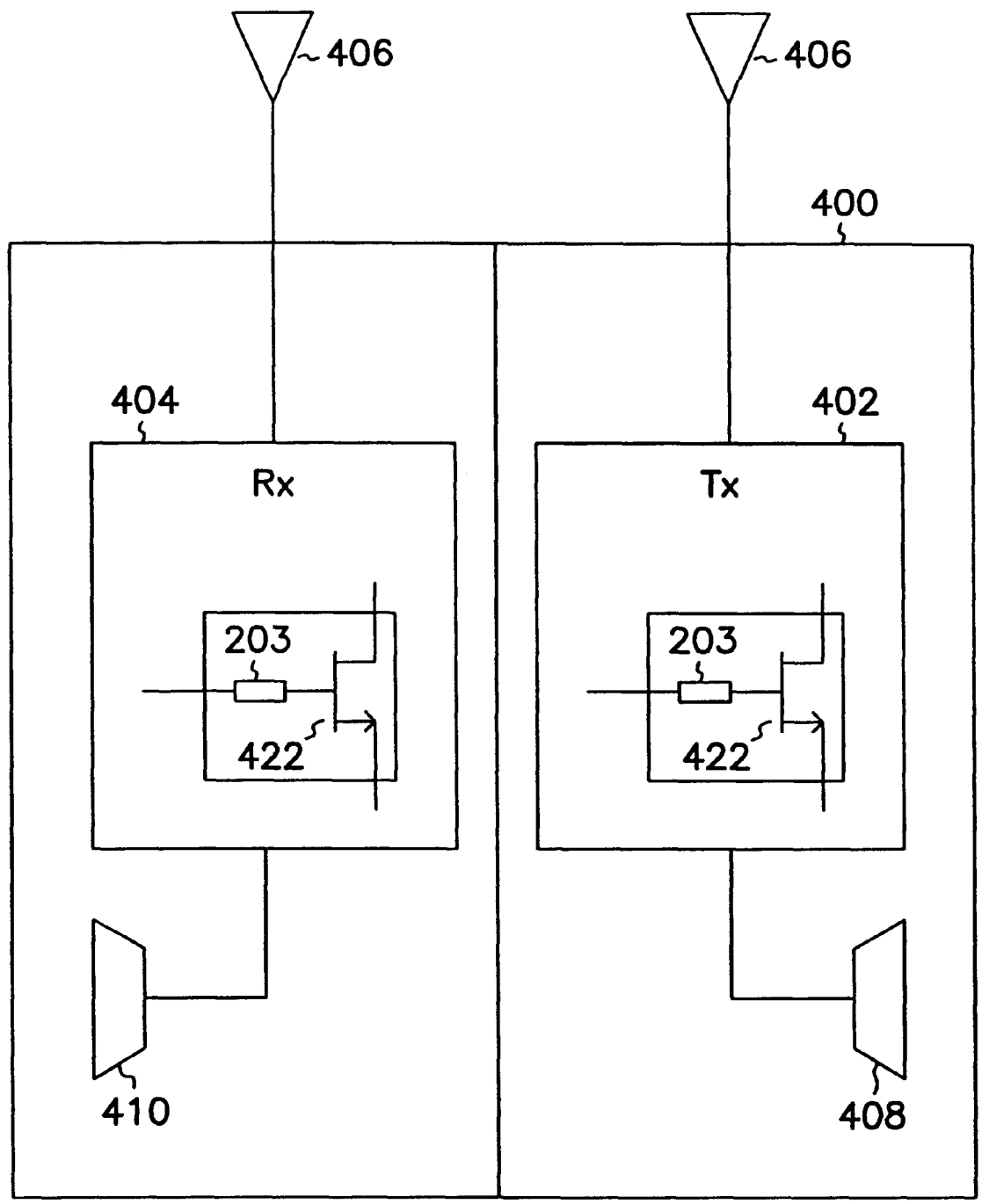
FIG. 4 illustrates a communications system including an inductive element according the present invention.

An inductive element 203 according to the present invention can be used in a communications system 400, such as a cellular telephone, as illustrated in FIG. 4. Multiple inductive elements 203 may be coupled in series and/or in parallel to provide a desired inductance value. The communications system 400 includes antennas 406 respectively coupled to a receiver 404 and a transmitter 402. The receiver 404 is coupled to a speaker 410. The transmitter 402 is coupled to a microphone 408. The transmitter 402 and receiver 404 each may include an inductive element 203 coupled to a semiconductor device 422, such as a transistor or a diode.

The inductive elements 203 in the communications system 400 enhance receiver 404 and transmitter 402 performance. The inductive element 203 improves the selectivity and noise figure of the receiver 404. The inductive element 203 improves the efficiency of the transmitter.

Conclusion

It is an advantage of the present invention that it enhances the Q and self-resonant frequency of inductive elements 203. It is also a benefit of the present invention that inductive elements 203 can be formed in conjunction with standard silicon IC processes. Furthermore, it is an additional benefit of the present invention that it provides inductive elements 203 that can be used in a communications system to improve selectivity, noise figure and efficiency.

It is to be understood that the above description is intended to be illustrative, and not restrictive. Many other embodiments will be apparent to those of skill in the art upon reviewing the above description. For example, the inductive elements 203 may be inductors, transformers or auto-transformers. The inductive elements 203 may be formed with conductors 207, 209, 364 having different elements or alloys which include aluminum, titanium, copper, gold, silver, or combinations thereof. Also, the inductive elements 203 may have a variety of shapes, which include, but are not limited to, rectangles, octagonals and spirals. Furthermore, the techniques described above can be used to form air bridge structures other than for inductive elements 203. Also, if the air bridge structures are sufficiently long, additional support structures 215, not shown, can be used to prop up the air bridge structures. The scope of the invention should, therefore, be determined with reference to the appended claims, along with the full scope of equivalents to which such claims are entitled.

We claim:

1. An inductive element on a substrate, comprising:

a base layer;

a first insulator formed on the base layer;

a first conductor formed on the first insulator;

a second insulator formed on the first insulator;

a second conductor, having first and second branches that are substantially parallel, formed on the second insulator;

a via hole, formed in the second insulator, coupling the first and second conductors;

a cavity, under the second conductor, formed in the first and second insulators; and a support structure, in the cavity, propping up the second conductor above the base layer.

2. The inductive element of claim 1, wherein a second via hole in the support structure couples the first and second conductors.

3. The inductive element of claim 1, wherein the cavity is filled with a polymer.

4. The inductive element of claim 3, wherein the polymer is a foam.

5. The inductive element of claim 1, wherein the second conductor further comprises a conductive pad that covers the support structure.

6. An inductive element on an integrated circuit, comprising:
- a base layer on the integrated circuit;
- a first insulator formed on the base layer;
- a first conductor formed on the first insulator;
- a second insulator formed on the first insulator;
- a second conductor, having first and second branches that are substantially parallel, formed on the second insulator;
- a via hole, formed in the second insulator, coupling the first and second conductors;
- a cavity, under the second conductor, formed in the first and second insulators; and
- a support structure, in the cavity, propping up the second conductor above the base layer.

7. The inductive element of claim 6, wherein a second via hole in the support structure couples the first and second conductors.

8. The inductive element of claim 6, wherein the cavity is filled with a polymer.

9. The inductive element of claim 8, wherein the polymer is a foam.

10. The inductive element of claim 6, wherein the second conductor further comprises a conductive pad that covers the support structure.

11. An inductive element on a substrate, comprising:
- a base layer;
- a first conductor buried in the base layer;
- an insulator formed on the base layer;
- a second conductor, having first and second branches that are substantially parallel, formed on the second insulator;
- a plug, formed in the base layer, coupled to the first conductor;
- a via hole formed in the insulator coupling the plug to the second conductor;
- a cavity, under second conductor, formed in the insulator; and
- a support structure, in the cavity, propping up the conductor above the base layer.

12. The inductive element of claim 11 wherein the first conductor is positioned between two buried insulators.

13. The inductive element of claim 11, further comprising a second via hole in the support structure that couples the first and second conductors.

14. The inductive element of claim 11, wherein the cavity is filled with a polymer.

15. The inductive element of claim 14, wherein the polymer is foam.

16. The inductive element of claim 11, wherein the second conductor further comprises a conductive pad that covers the support structure.

17. An inductive element on a substrate, comprising:
- a first insulator on a base layer;
- a first conductor on the first insulator;
- a second insulator, formed over the first insulator, from a low dielectric inorganic insulator;
- a via hole in the second insulator;
- a cavity under the second conductor formed in the insulator;
- a support structure in the cavity propping up the second conductor above the base layer
- a second conductor, formed on the second insulator, that is coupled to the first conductor by the via; and
- wherein the first and second conductors form substantially parallel branches.

18. The inductive element of claim 17, wherein the second insulator comprises porous silicon.

* * * * *